United States Patent
Lee et al.

(10) Patent No.: US 12,107,052 B2
(45) Date of Patent: Oct. 1, 2024

(54) OVERLAY MARK FORMING MOIRE PATTERN, OVERLAY MEASUREMENT METHOD USING SAME, OVERLAY MEASUREMENT APPARATUS USING SAME, AND MANUFACTURING METHOD OF SEMICONDUCTOR DEVICE USING SAME

(71) Applicant: AUROS TECHNOLOGY, INC., Hwaseong-si (KR)

(72) Inventors: Hyun Chul Lee, Hwaseong-si (KR); Hyun Jin Chang, Seoul (KR)

(73) Assignee: AUROS TECHNOLOGY, INC., Hwaseong-si (KR)

( * ) Notice: Subject to any disclaimer, the term of this patent is extended or adjusted under 35 U.S.C. 154(b) by 0 days.

(21) Appl. No.: 18/312,177

(22) Filed: May 4, 2023

(65) Prior Publication Data

US 2024/0136300 A1    Apr. 25, 2024

(30) Foreign Application Priority Data

Oct. 17, 2022  (KR) .................... 10-2022-0132945

(51) Int. Cl.
*H01L 23/544* (2006.01)
*G03F 7/00* (2006.01)
*G06T 7/00* (2017.01)

(52) U.S. Cl.
CPC ........ *H01L 23/544* (2013.01); *G03F 7/70633* (2013.01); *G03F 7/70683* (2013.01);
(Continued)

(58) Field of Classification Search
CPC ......... H01L 23/544; H01L 2223/54426; G03F 7/70633; G03F 7/70683; G06T 7/001; G06T 2207/30148; G06T 2207/30204
See application file for complete search history.

(56) References Cited

U.S. PATENT DOCUMENTS

2003/0021467 A1*  1/2003  Adel ..................... G06V 40/171
                                             382/145
2004/0212796 A1*  10/2004 Adel ................... G03F 7/70633
                                             356/237.1
(Continued)

FOREIGN PATENT DOCUMENTS

JP    2007103928 A    4/2007
JP    2017040941 A    2/2017
(Continued)

*Primary Examiner* — Brian Turner
(74) *Attorney, Agent, or Firm* — NKL Law; Jae Youn Kim

(57) ABSTRACT

An overlay mark forming a Moire pattern, an overlay measurement method using the overlay mark, an overlay measurement apparatus using the overlay mark, and a manufacturing method of a semiconductor device using the overlay mark are provided. The overlay mark for measuring an overlay based on an image is configured to determine a relative misalignment between at least two pattern layers. The overlay mark includes a first overlay mark including a pair of first grating patterns which has a first pitch along a first direction and which is rotationally symmetrical by 180 degrees, and includes a second overlay mark including a pair of second grating patterns and a pair of third grating patterns. The second grating patterns partially overlap the first grating patterns and are rotationally symmetrical by 180 degrees, and the third grating patterns partially overlap the first grating patterns and are rotationally symmetrical by 180 degrees.

5 Claims, 5 Drawing Sheets

(52) U.S. Cl.
CPC .. *G03F 7/706837* (2023.05); *G03F 7/706851* (2023.05); *G06T 7/001* (2013.01); *G06T 2207/30148* (2013.01); *G06T 2207/30204* (2013.01); *H01L 2223/54426* (2013.01)

(56) References Cited

U.S. PATENT DOCUMENTS

2019/0219930 A1\* 7/2019 Yang ................ G03F 9/7049
2021/0072650 A1    3/2021 Feler et al.

FOREIGN PATENT DOCUMENTS

| JP | 2020-112807 A | 7/2020 |
| JP | 2022058401 A | 4/2022 |
| KR | 100225230 B1 | 10/1999 |
| KR | 10-2000-0006182 A | 1/2000 |
| KR | 20060110940 A | 10/2006 |
| KR | 10-1604789 B1 | 3/2016 |
| KR | 10-2020-0096843 A | 8/2020 |
| KR | 10-2022-0062348 A | 5/2022 |
| KR | 102440758 B1 | 9/2022 |
| KR | 20220137370 A | 10/2022 |
| WO | 2021050363 A1 | 3/2021 |

\* cited by examiner

OVERLAY MARK FORMING MOIRE PATTERN, OVERLAY MEASUREMENT METHOD USING SAME, OVERLAY MEASUREMENT APPARATUS USING SAME, AND MANUFACTURING METHOD OF SEMICONDUCTOR DEVICE USING SAME

CROSS REFERENCE TO RELATED APPLICATION

The present application claims priority to Korean Patent Application No. 10-2022-0132945, filed Oct. 17, 2022, the entire contents of which are incorporated herein for all purposes by this reference.

BACKGROUND OF THE INVENTION

Field of the Invention

The present disclosure relates to an overlay mark forming a Moire pattern, an overlay measurement method using the overlay mark, an overlay measurement apparatus using the overlay mark, and a manufacturing method of a semiconductor device using the overlay mark.

Description of the Related Art

On a substrate of a semiconductor, a plurality of pattern layers is sequentially formed. In addition, by performing double patterning and so on, a circuit of one layer in which the circuit is divided into two patterns is formed. A desired semiconductor device may be manufactured only when such pattern layers or such a plurality of patterns in one layer is formed accurately at a predetermined position on a substrate of the semiconductor (semiconductor substrate).

Therefore, in order to check that the pattern layers are accurately aligned, overlay marks formed simultaneously with the pattern layers are used.

A method of measuring an overlay by using an overlay mark is as follows. Firstly, on a pattern layer that is formed in a previous process such as an etching process, for example, one structure that is a part of an overlay mark (overlay structure of the pattern layer) is formed simultaneously with the formation of the pattern layer. Then, in a subsequent process such as a photo-lithography process, for example, the other structure of the overlay mark (overlay structure of the photoresist layer) is formed on a photoresist.

Then, an image (obtaining the image by passing light through a photoresist layer) of the overlay structure of the pattern layer and an image of the overlay structure of the photoresist layer in which the overlay structures are formed are obtained by using an overlay measurement apparatus. The overlay measurement apparatus measures an overlay value by measuring an offset value between centers of the images.

More specifically, in Japanese Patent Application Publication No. 2020-112807, a method of determining a relative misalignment between different layers or between different patterns is disclosed, in which the method is performed by capturing an image of an overlay mark formed on a substrate, selecting a plurality of working zones in the captured image, forming signals having information about selected working zones, respectively, and comparing the signals.

In addition, in Korean Patent No. 10-1604789, disclosed is an overlay measurement method in which the method is performed by obtaining an image of an overlay mark; obtaining a 180 degree rotated image of the overlay mark with respect to a center of the obtained image; comparing the two images; setting a center of a current image as a center of the overlay mark when the two images coincide with each other; and when the two images do not coincide with each other, repeatedly changing positions, obtaining an image of the overlay mark, obtaining a 180 degrees rotated image of the overlay mark with respect to a center of the image, comparing the two images until the two images coincide with each other so that a center of a current image can now be set as the center of the of the overlay mark.

In addition, in Korean Patent Application Publication No. 10-2000-0006182, a method of measuring an overlay is disclosed, in which the method is performed by forming a Moire pattern using repetitive overlay marks overlapping each other, observing the Moire pattern optically, and comparing the Moire pattern in an aligned state with the observed Moire pattern.

In addition, in U.S. Patent Application Publication No. 2021-0072650A1, a method of measuring an overlay in an X-axis direction and a Y-axis direction is disclosed, in which the method is performed by forming and using four pairs of Moire patterns that are rotationally symmetrical by 180 degrees by using one-dimensional grating patterns in the X-axis direction and one-dimensional grating patterns in the Y-axis direction that overlap each other.

Such a method using images of Moire patterns has an advantage of being more useful than the method using an image of an overlay mark in that the method using the images of the Moire patterns amplifies and indicates misalignment between layers. However, such a method requires high precision in a grating pattern for forming a Moire pattern. Since a conventional overlay mark forming a Moire pattern is configured such that grating patterns disposed on a center portion of the overlay mark and grating patterns disposed on an outer portion are formed in different pitches, there is a problem because precision is difficult to maintain in such a method.

Document of Related Art (Patent Document 1) Japanese Patent Application Publication No. 2020-112807
(Patent Document 2) Korean Patent No. 10-1604789
(Patent Document 3) Korean Patent Application Publication No. 10-2000-0006182
(Patent Document 4) U.S. Patent Application Publication No. 2021-0072650A1

SUMMARY OF THE INVENTION

Accordingly, one or more embodiments of the present disclosure are directed toward solving the above problems occurring in the related art. In one or more embodiments, the present disclosure provides an overlay mark capable of reducing noise and an error of a Moire pattern by increasing precision of a grating pattern, an overlay measurement method using the overlay mark, an overlay measurement apparatus using the overlay mark, and a manufacturing method of a semiconductor device using the overlay mark.

In one or more embodiments of the present disclosure, there is provided an overlay mark for measuring an overlay based on an image, the overlay mark being configured to determine a relative misalignment between at least two pattern layers, and the overlay mark including: a first overlay mark including a pair of first grating patterns, the pair of first grating patterns being formed together with a first pattern layer, and the pair of first grating patterns having a first pitch along a first direction and being rotationally symmetrical by 180 degrees with each other; and a second overlay mark including a pair of second grating patterns and a pair of third grating patterns, the pair of second grating patterns being formed together with a second pattern layer, the pair of second grating patterns having a second pitch along the first direction in which the second pitch is different from the first pitch, the pair of second grating patterns partially overlapping the first grating patterns and being rotationally symmetrical by 180 degrees with each other, the pair of third grating patterns being formed together with the second pattern layer, the pair of third grating patterns having a third pitch along the first direction in which the third pitch is different from the first pitch and the second pitch, and the pair of third grating patterns partially overlapping the first grating patterns and being rotationally symmetrical by 180 degrees with each other.

The first grating patterns and the second grating patterns that overlap each other may form a pair of first Moire patterns rotationally symmetrical by 180 degrees with respect to a first center of symmetry.

The first grating patterns and the third grating patterns that overlap each other may form a pair of second Moire patterns rotationally symmetrical by 180 degrees with respect to a second center of symmetry.

The first center of symmetry and the second center of symmetry may coincide with each other when an overlay error is zero.

An error in the first direction between the first center of symmetry and the second center of symmetry may represent an overlay error in the first direction between the first pattern layer and the second pattern layer.

The second grating patterns and the third grating patterns may be disposed parallel to each other.

One of the second pitch and the third pitch may be larger than the first pitch and the other of the second pitch and the third pitch may be smaller than the first pitch.

The first grating patterns may include a plurality of first bars having a first bar length, the second grating patterns may include a plurality of second bars having a second bar length, the third grating patterns may include a plurality of third bars having a third bar length, and the first bar length may be equal to or more than a sum of the second bar length and the third bar length.

Pitches of the first and the second Moire patterns may be larger than an optical resolution of an overlay measurement apparatus, and the first to the third pitches of the first to the third grating patterns may be smaller than the optical resolution of the overlay measurement apparatus.

The first overlay mark may further include a pair of fourth grating patterns, the pair of fourth grating patterns being formed together with the first pattern layer, and the pair of fourth grating patterns having a fourth pitch along a second direction orthogonal to the first direction and being rotationally symmetrical by 180 degrees with each other.

In addition, the second overlay mark may include a pair of fifth grating patterns and a pair of sixth grating patterns, the pair of fifth grating patterns being formed together with the second pattern layer, the pair of fifth grating patterns having a fifth pitch along the second direction in which the fifth pitch is different from the fourth pitch, the pair of fifth grating patterns partially overlapping the fourth grating patterns and being rotationally symmetrical by 180 degrees with each other, the pair of sixth grating patterns being formed together with the second pattern layer, the pair of sixth grating patterns having a sixth pitch along the second direction in which the sixth pitch is different from the fourth pitch and the fifth pitch, and the pair of sixth grating patterns partially overlapping the fourth grating patterns and being rotationally symmetrical by 180 degrees with each other.

The fourth grating patterns and the fifth grating patterns that overlap each other may form a pair of third Moire patterns rotationally symmetrical by 180 degrees with respect to a third center of symmetry.

the fourth grating patterns and the sixth grating patterns that overlap each other may form a pair of fourth Moire patterns rotationally symmetrical by 180 degrees with respect to a fourth center of symmetry.

The third center of symmetry and the fourth center of symmetry may coincide with each other when the overlay error is zero.

An error in the second direction between the third center of symmetry and the fourth center of symmetry may represent the overlay error in the second direction between the first pattern layer and the second pattern layer.

In one or more embodiments of the present disclosure, there is provided an overlay measurement method measuring an overlay between a plurality of consecutive pattern layers, the overlay measurement method may include obtaining a Moire pattern image formed by an overlay mark that is formed simultaneously with forming the plurality of consecutive pattern layers; and analyzing the Moire pattern image, wherein the overlay mark is the overlay mark described above.

In one or more embodiments of the present disclosure, there is provided a manufacturing method of a semiconductor device, the manufacturing method may include forming an overlay mark simultaneously with forming a plurality of consecutive pattern layers; measuring an overlay value by using the overlay mark; and using the measured overlay value to control the forming the plurality of consecutive pattern layers, wherein the overlay mark is the overlay mark described above.

In one or more embodiments of the present disclosure, there is provided an overlay measurement apparatus including an illumination optical system illuminating an overlay mark that is formed simultaneously with forming a plurality of consecutive pattern layers, an imaging optical system imaging a Moire pattern image by condensing light reflected from the overlay mark, and an image detector obtaining the Moire pattern image imaged by the imaging optical system, in which the overlay measurement apparatus is configured to measure an overlay between the plurality of consecutive pattern layers by processing the Moire pattern image that is obtained by the image detector, wherein the overlay mark is the overlay mark described above.

In the overlay mark, the overlay measurement method using the overlay mark, the overlay measurement apparatus using the overlay mark, and the manufacturing method of the semiconductor device using the overlay mark according to one or more embodiments of the present disclosure, grating patterns separated into two on a lower side or an upper side are simplified into one grating pattern having a single pitch and having a wide area, so that there is an advantage that precision of the grating pattern may be increased and noise may be reduced.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
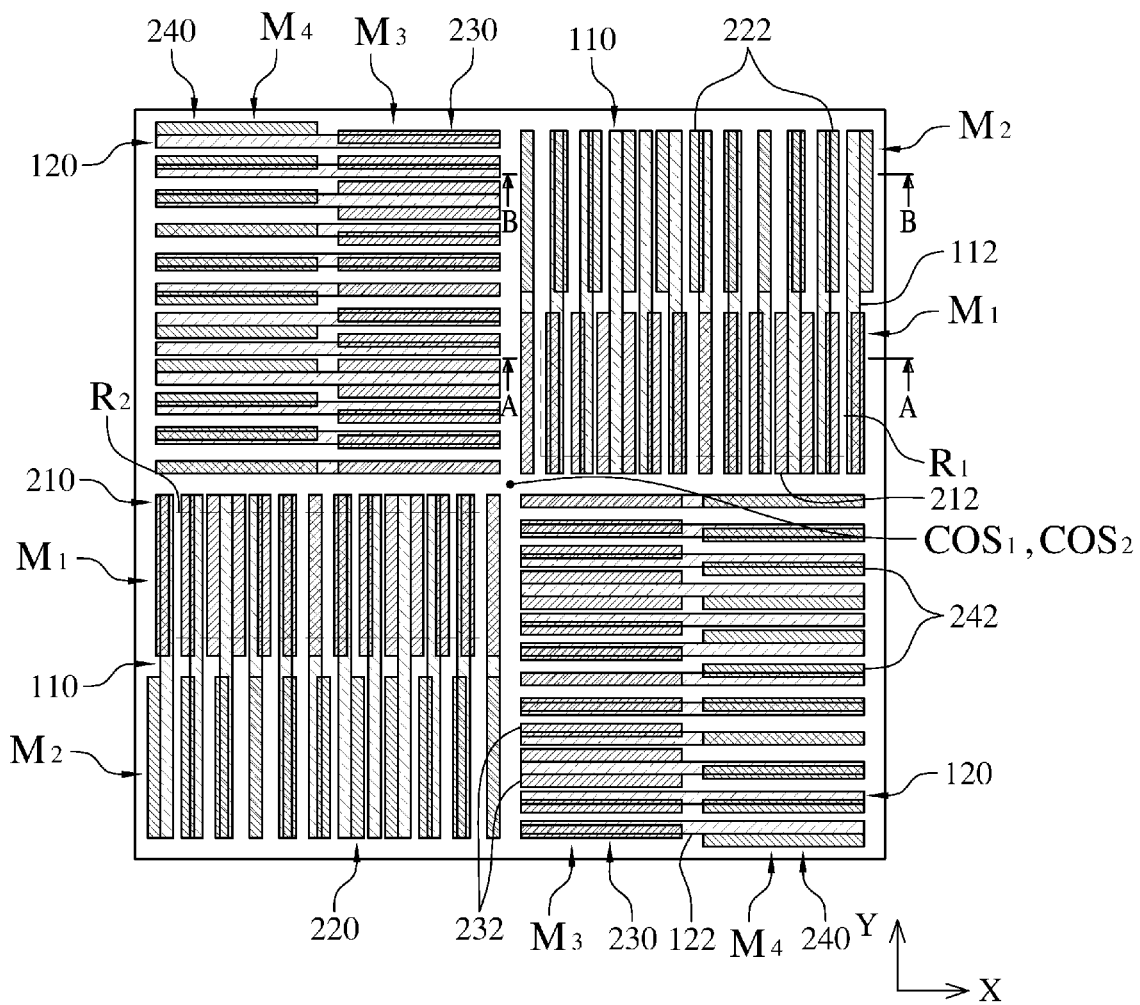
FIG. 1 is a plan view illustrating an overlay mark according to an embodiment of the present disclosure.

Hereinafter, embodiments of the present disclosure will be described in detail with reference to the accompanying drawings. However, the embodiments of the present disclosure may be modified into various other forms, and the scope of the present disclosure should not be construed as being limited to the embodiments described below. Embodiments of the present disclosure are provided to more completely describe the present disclosure to those of ordinary skill in the art. Accordingly, the shapes of elements in the drawings are exaggerated in order to emphasize a clearer description. The elements indicated by the same reference numerals in the drawings mean the same elements.

Figure 2:
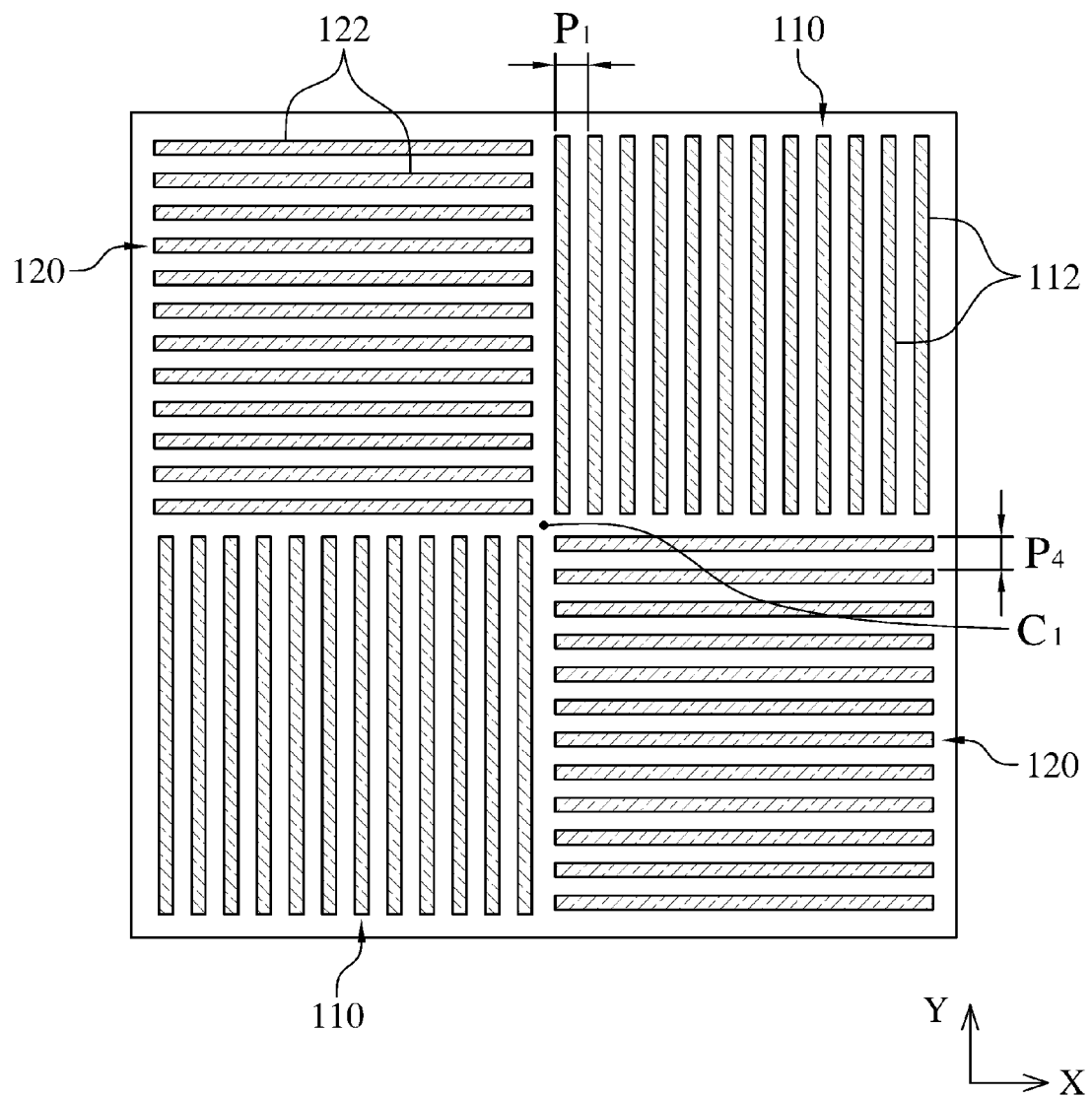
FIG. 2 is a plan view illustrating a first overlay mark illustrated in FIG. 1.
Figure 3:
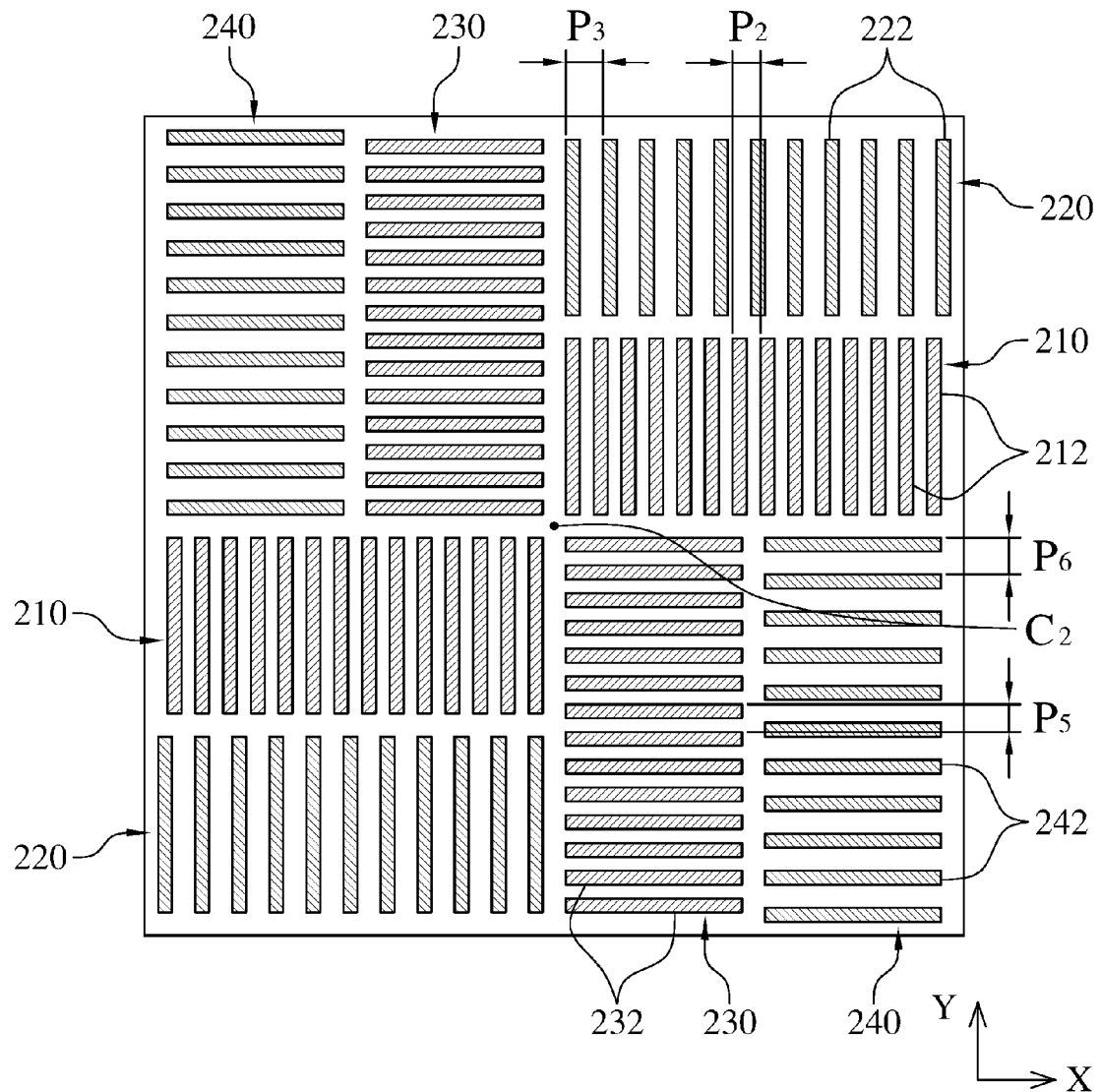
FIG. 3 is a plan view illustrating a second overlay mark illustrated in FIG. 1.
Figure 4:
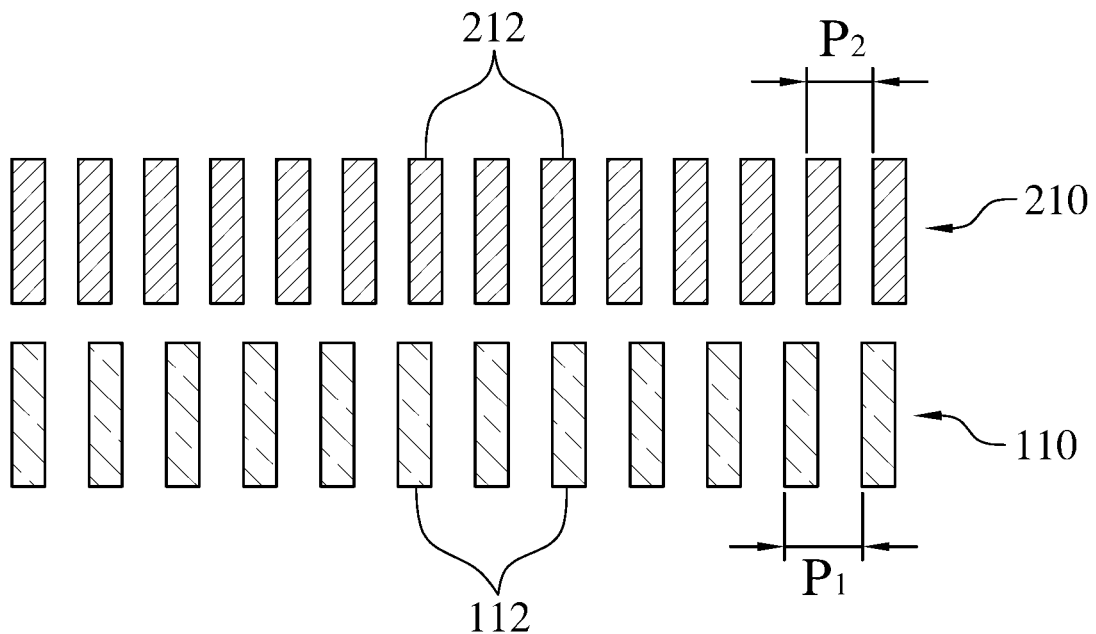
FIG. 4 is a cross-sectional view illustrating the overlay mark taken along line A-A in FIG. 1.
Figure 5:
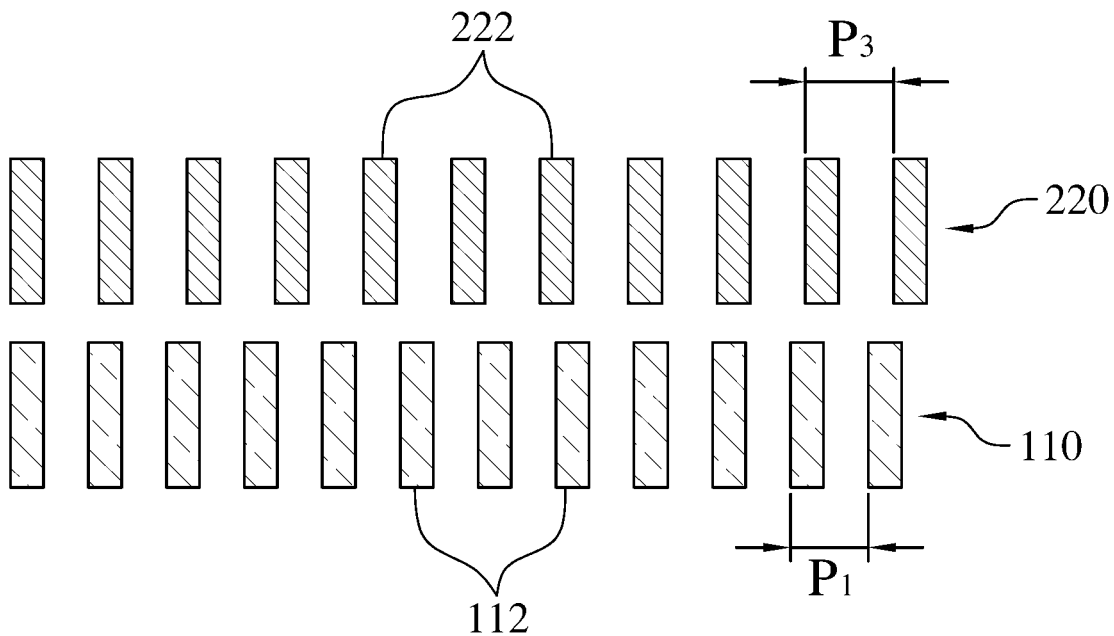
FIG. 5 is a cross-sectional view illustrating the overlay mark taken along line B-B in FIG. 1.

FIG. 1 is a plan view illustrating an overlay mark according to an embodiment of the present disclosure, FIG. 2 is a plan view illustrating a first overlay mark illustrated in FIG. 1, FIG. 3 is a plan view illustrating a second overlay mark illustrated in FIG. 1, FIG. 4 is a cross-sectional view illustrating the overlay mark taken along line A-A in FIG. 1, and FIG. 5 is a cross-sectional view illustrating the overlay mark taken along line B-B in FIG. 1.

In FIG. 1, an overlay mark 10 in a state in which a first overlay mark 100 and a second overlay mark 200 are aligned is illustrated. The first overlay mark 100 is formed simultaneously with a first pattern layer (a lower layer in FIG. 1), and the second overlay mark 200 is formed simultaneously with a second pattern layer (an upper layer in FIG. 1).

As illustrated in FIG. 2, the first overlay mark 100 is provided with a pair of first grating patterns 110. The pair of first grating patterns 110 is rotationally symmetrical by 180 degrees with respect to a center of symmetry $C_1$ of the first overlay mark 100.

The first grating pattern 110 has a first pitch $P_1$ along a first direction (an X-axis direction in FIG. 2). The first grating pattern 110 has a plurality of first thin bars 112 having a first bar length.

As illustrated in FIG. 3, the second overlay mark 200 is provided with a pair of second grating patterns 210 and a pair of third grating patterns 220. The pair of second grating patterns 210 is rotationally symmetrical by 180 degrees with respect to a center of symmetry $C_2$ of the second overlay mark 200. The pair of third grating patterns 220 is also rotationally symmetrical by 180 degrees with respect to the center of symmetry $C_2$ of the second overlay mark 200.

The second grating pattern 210 and the third grating pattern 220 are disposed parallel to each other. The second grating pattern 210 is disposed on a center portion of the second overlay mark 200, and is disposed on an outer side of the third grating pattern 220. The second grating pattern 210 and the third grating pattern 220 each overlap a part of the first grating pattern 110. The second grating pattern 210 and the third grating pattern 220 are substantially disposed at an inner portion of a section defined by an outer portion of the first grating pattern 110.

The second grating pattern 210 has a second pitch $P_2$ along the X-axis direction. The second grating pattern 210 has a plurality of second thin bars 212 having a second bar length. The second pitch $P_2$ is different from the first pitch $P_1$.

The third grating pattern 220 has a third pitch $P_3$ along the X-axis direction. The third grating pattern 220 has a plurality of third thin bars 222 having a third bar length. The third pitch $P_3$ is different from the first pitch $P_1$, and is different from the second pitch $P_2$.

The sum of a length of the second bar 212 constituting the second grating pattern 210 and a length of the third bar 222 constituting the third grating pattern 220 is smaller than a length of the first bar 112 constituting the first grating pattern 110.

Preferably, one of the third pitch $P_3$ and the second pitch $P_2$ is larger than the first pitch $P_1$ and the other is smaller than the first pitch $P_1$.

As illustrated in exemplary embodiments shown in FIGS. 4 and 5, the second pitch $P_2$ is smaller than the first pitch $P_1$, and the third pitch $P_3$ is larger than the first pitch $P_1$. The pitches $P_1$, $P_2$, and $P_3$ may be formed opposite to the configuration described above.

As illustrated in FIG. 1, when light is irradiated onto the first grating pattern 110 and the second grating pattern 210 that overlap each other, a first Moire pattern $M_1$ is formed by an interference phenomenon that occurs when periodic patterns overlap. The first Moire patterns $M_1$ are provided with a first center of symmetry $COS_1$. The first Moire patterns $M_1$ are rotationally symmetrical by 180 degrees with respect to the first center of symmetry $COS_1$.

At this time, in accordance with Equation 1 below, a pitch $P_{M1}$ of the first Moire pattern $M_1$ is determined by the first pitch $P_1$ of the first grating pattern 110 and the second pitch $P_2$ of the second grating pattern 210. In accordance with Equation 1 below, the pitch $P_{M1}$ of the first Moire pattern $M_1$ is much larger than the first pitch $P_1$ of the first grating pattern 110 and the second pitch $P_2$ of the second grating pattern 210.

$$P_{M_1} = \frac{P_1 P_2}{(P_1 - P_2)} \qquad \text{[Equation 1]}$$

Preferably, in one or more embodiments the pitch $P_{M1}$ of the first Moire pattern $M_1$ is larger than an optical resolution of an overlay measurement apparatus, and preferably, in one or more embodiments, the first pitch $P_1$ of the first grating pattern 110 and the second pitch $P_2$ of the second grating pattern 210 are smaller than the optical resolution of the overlay measurement apparatus. This is to minimize occurrence of noise in the first Moire pattern $M_1$ by various factors such as interference by light reflected from the grating patterns 110 and 210, particularly, the second grating pattern 210.

In addition, a relative movement of the second grating pattern 210 relative to the first grating pattern 110 in a grating element (bars) alignment direction (the X-axis direction in an exemplary embodiment) causes a movement of the first Moire pattern $M_1$. In addition, a first Moire gain $G_{M1}$ that is a ratio of a relative movement distance of the second grating pattern 210 and a movement distance of the first Moire pattern $M_1$ is determined by Equation 2 below.

$$G_{M_1} = \frac{P_1}{(P_1 - P_2)} \quad \text{[Equation 2]}$$

In accordance with Equation 2 above, even if the second grating pattern 210 moves slightly, the first Moire pattern $M_1$ moves a relatively much longer distance. Therefore, a fine overlay error is capable of being measured through an image of a Moire pattern.

In the above exemplary embodiment, since the first pitch $P_1$ is larger than the second pitch $P_2$, the first Moire gain $G_{M1}$ is a positive number. That is, the first Moire pattern $M_1$ moves in a direction that is same as a moving direction of the second grating pattern 210.

In addition, the first grating pattern 110 and the third grating pattern 220 form a second Moire pattern $M_2$. The second Moire patterns $M_2$ are provided with a second center of symmetry $COS_2$. The second Moire patterns $M_2$ are rotationally symmetrical by 180 degrees with respect to the second center of symmetry $COS_2$.

In accordance with Equation 3 below, a pitch $P_{M2}$ of the second Moire pattern $M_2$ is determined by the first pitch $P_1$ of the first grating pattern 110 and the third pitch $P_3$ of the third grating pattern 220.

$$P_{M_2} = \frac{P_1 P_3}{(P_1 - P_3)} \quad \text{[Equation 3]}$$

In addition, a second Moire gain $G_{M2}$ that is a ratio of a relative movement distance of the third grating pattern 220 and a movement distance of the second Moire pattern $M_2$ is determined by Equation 4 below.

Preferably, in one or more embodiments, the pitch $P_{M2}$ of the second Moire pattern $M_2$ is larger than the optical resolution of the overlay measurement apparatus, and preferably, in one or more embodiments, the third pitch $P_3$ of the third grating pattern 220 is smaller than the optical resolution of the overlay measurement apparatus. This is to minimize the occurrence of noise in the Moire pattern due to the influence of interference by light reflected from the grating pattern.

$$G_{M_2} = \frac{P_1}{(P_1 - P_3)} \quad \text{[Equation 4]}$$

In accordance with Equation 4 above, even if the third grating pattern 220 moves slightly, the second Moire pattern $M_2$ moves a relatively much longer distance. In an exemplary embodiment above, since the third pitch $P_3$ is larger than the first pitch $P_1$, the second Moire gain $G_{M2}$ is a negative number. That is, the second Moire pattern $M_2$ moves in a direction opposite to a moving direction of the third grating pattern 220. Therefore, in an exemplary embodiment above, when the second overlay mark 200 moves with respect to the first overlay mark 100, the first Moire pattern $M_1$ and the second Moire pattern $M_2$ moves in opposite directions from each other.

As illustrated in FIG. 1, when the overlay mark 10 is aligned, the first center of symmetry $COS_1$ of the first Moire patterns $M_1$ and the second center of symmetry $COS_2$ of the second Moire patterns $M_2$ coincide with (overlap) each other. When the overlay mark 10 is not in the aligned state, the first center of symmetry $COS_1$ of the first Moire patterns $M_1$ and the second center of symmetry $COS_2$ of the second Moire patterns $M_2$ do not coincide with each other.

By using a difference between the first center of symmetry $COS_1$ of the first Moire patterns $M_1$ and the second center of symmetry $COS_2$ of the second Moire patterns $M_2$ in the first direction (the X-axis direction), an overlay error $\Delta X$ in the first direction may be measured.

As illustrated in FIGS. 2 and 3, the first overlay mark 100 is provided with a pair of fourth grating patterns 120. In addition, the second overlay mark 200 is provided with a pair of fifth grating patterns 230 and a pair of sixth grating patterns 240.

The fourth grating patterns 120, the fifth grating patterns 230, and the sixth grating patterns 240 are used for measuring an overlay error $\Delta Y$ in a second direction.

As illustrated in FIG. 2, the pair of fourth grating patterns 120 is rotationally symmetrical by 180 degrees with respect to the center of symmetry $C_1$ of the first overlay mark 100.

The fourth grating pattern 120 has a fourth pitch $P_4$ along the second direction (a Y-axis direction in FIG. 1). The fourth grating pattern 120 has a plurality of fourth thin bars 122 having a fourth bar length.

It is illustrated in FIGS. 1 and 2 that a width of the fourth bars 122 and the fourth pitch $P_4$ are the same as a width of the first bars 112 and the first pitch $P_1$, but may be different from each other.

As illustrated in FIG. 3, the pair of fifth grating patterns 230 is rotationally symmetrical by 180 degrees with respect to the center of symmetry $C_2$ of the second overlay mark 200. The pair of sixth grating patterns 240 is also rotationally symmetrical by 180 degrees with respect to the center of symmetry $C_2$ of the second overlay mark 200.

The fifth grating pattern 230 and the sixth grating pattern 240 are disposed parallel to each other. The fifth grating pattern 230 is disposed on the center portion of the second overlay mark 200, and is disposed on an outer side of the sixth grating pattern 240. The fifth grating pattern 230 and the sixth grating pattern 240 each overlap a part of the fourth grating pattern 120. The fifth grating pattern 230 and the sixth grating pattern 240 substantially disposed at an inner portion of a section defined by an outer portion of the fourth grating pattern 120.

The fifth grating pattern 230 has a fifth pitch $P_5$ along the Y-axis direction. The fifth grating pattern 230 has a plurality of fifth thin bars 232 having a fifth bar length. The fifth pitch $P_5$ is different from the fourth pitch $P_4$.

It is illustrated in FIGS. 1 and 3 that a width of the fifth bars 232 and the fifth pitch $P_5$ are the same as a width of the second bars 212 and the second pitch $P_2$, but may be different from each other.

The sixth grating pattern 240 has a sixth pitch $P_6$ along the Y-axis direction. The sixth grating pattern 240 has a plurality of sixth thin bars 242 having a sixth bar length. The sixth pitch $P_6$ is different from the fourth pitch $P_4$, and is different from the fifth pitch $P_5$.

It is illustrated in FIGS. 1 and 3 that a width of the sixth bars 242 and the sixth pitch $P_6$ are the same as a width of the third bars 222 and the third pitch $P_3$, but may be different from each other.

The sum of a length of the fifth bar 232 constituting the fifth grating pattern 230 and a length of the sixth bar 242 constituting the sixth grating pattern 240 is smaller than a length of the fourth bar 122 constituting the fourth grating pattern 120.

Preferably, one of the fifth pitch $P_5$ and the sixth pitch $P_6$ is larger than the fourth pitch $P_4$ and the other is smaller than the fourth pitch $P_4$.

In an exemplary embodiment above, the fifth pitch $P_5$ is smaller than the fourth pitch $P_4$, and the sixth pitch $P_6$ is larger than the fourth pitch $P_4$. The pitches $P_4$, $P_5$, and $P_6$ may be formed opposite to the configuration described above.

As illustrated in FIG. 1, when light is irradiated onto the fourth grating pattern 120 and the fifth grating pattern 230, a third Moire pattern $M_3$ is formed by an interference phenomenon that occurs when periodic patterns overlap. The third Moire patterns $M_3$ are provided with a third center of symmetry $COS_3$. The third Moire patterns $M_3$ are rotationally symmetrical by 180 degrees with respect to the third center of symmetry $COS_3$. The third center of symmetry $COS_3$ may coincide with the first center of symmetry $COS_1$.

At this time, in accordance with Equation 5 below, a pitch $P_{M3}$ of the third Moire pattern $M_3$ is determined by the fourth pitch $P_4$ of the fourth grating pattern 120 and the fifth pitch $P_5$ of the fifth grating pattern 230. In accordance with Equation 5 below, the pitch $P_{M3}$ of the third Moire pattern $M_3$ is much larger than the fourth pitch $P_4$ of the fourth grating pattern 120 and the fifth pitch $P_5$ of the fifth grating pattern 230.

$$P_{M_3} = \frac{P_4 P_5}{(P_4 - P_5)} \quad \text{[Equation 5]}$$

Preferably, in one or more embodiments, the pitch $P_{M3}$ of the third Moire pattern $M_3$ is larger than the optical resolution of the overlay measurement apparatus, and preferably, in one or more embodiments, the fourth pitch $P_4$ of the fourth grating pattern 120 and the fifth pitch $P_5$ of the fifth grating pattern 220 are smaller than the optical resolution of the overlay measurement apparatus. This is to minimize occurrence of noise in the third Moire pattern $M_3$ by various factors such as interference by light reflected from the grating patterns 120 and 230, particularly, the fifth grating pattern 230 that is positioned at the upper layer.

In addition, a relative movement of the fifth grating pattern 230 relative to the fourth grating pattern 120 in a grating element (bars) alignment direction (the Y-axis direction in an above exemplary embodiment) causes a movement of the third Moire pattern $M_3$. In addition, a third Moire gain $G_{M3}$ that is a ratio of a relative movement distance of the fifth grating pattern 230 and a movement distance of the third Moire pattern $M_3$ is determined by Equation 6 below.

$$G_{M_3} = \frac{P_4}{(P_4 - P_5)} \quad \text{[Equation 6]}$$

In accordance with Equation 6 above, even if the fifth grating pattern 230 moves slightly, the third Moire pattern $M_3$ moves a relatively much longer distance. Therefore, a fine overlay error is capable of being measured through an image of a Moire pattern.

In addition, the fourth grating pattern 120 and the sixth grating pattern 240 form a fourth Moire pattern $M_4$. The fourth Moire patterns $M_4$ are provided with a fourth center of symmetry $COS_4$. The fourth Moire patterns $M_4$ are rotationally symmetrical by 180 degrees with respect to the fourth center of symmetry $COS_4$.

In accordance with Equation 7 below, a pitch $P_{M4}$ of the fourth Moire pattern $M_4$ is determined by the fourth pitch $P_4$ of the fourth grating pattern 120 and the sixth pitch $P_6$ of the sixth grating pattern 240.

$$P_{M_4} = \frac{P_4 P_6}{(P_4 - P_6)} \quad \text{[Equation 7]}$$

In addition, a fourth Moire gain $G_{M4}$ that is a ratio of a relative movement distance of the sixth grating pattern 240 and a movement distance of the fourth Moire pattern $M_4$ is determined by Equation 8 below.

Preferably, in one or more embodiments, the pitch $P_{M4}$ of the fourth Moire pattern $M_4$ is larger than the optical resolution of the overlay measurement apparatus, and preferably, in one or more embodiments, the sixth pitch $P_6$ of the sixth grating pattern 240 is smaller than the optical resolution of the overlay measurement apparatus. This is to minimize the occurrence of noise in the Moire pattern due to the influence of interference by light reflected from the grating pattern.

$$G_{M_4} = \frac{P_4}{(P_4 - P_6)} \quad \text{[Equation 8]}$$

In accordance with Equation 8 above, even if the sixth grating pattern 240 moves slightly, the fourth Moire pattern $M_4$ moves a relatively much longer distance.

When the overlay mark 10 is aligned, the third center of symmetry $COS_3$ of the third Moire patterns $M_3$ and the fourth center of symmetry $COS_4$ of the fourth Moire patterns $M_4$ coincide with (overlap) each other. When the overlay mark 10 is not in the aligned state, the third center of symmetry $COS_3$ of the third Moire patterns $M_3$ and the fourth center of symmetry $COS_4$ of the fourth Moire patterns $M_4$ do not coincide with each other.

By using a difference between the third center of symmetry $COS_3$ of the third Moire patterns $M_3$ and the fourth center of symmetry $COS_4$ of the fourth Moire patterns $M_4$ in the second direction (the Y-axis direction), the overlay error $\Delta Y$ in the second direction may be measured.

Hereinafter, an overlay measurement method using the overlay mark 10 described above will be described.

The overlay measurement method includes a process of obtaining a Moire pattern image formed by the overlay mark 10, and includes a process of analyzing the Moire pattern image. The overlay mark 10 is formed simultaneously with forming two consecutive pattern layers.

The process of obtaining the Moire pattern image is a process of obtaining images of the first to the fourth Moire patterns $M_1$, $M_2$, $M_3$, and $M_4$ by using the overlay measurement apparatus. For example, the process is a process of obtaining an image as illustrated in FIG. 1.

Figure 6:
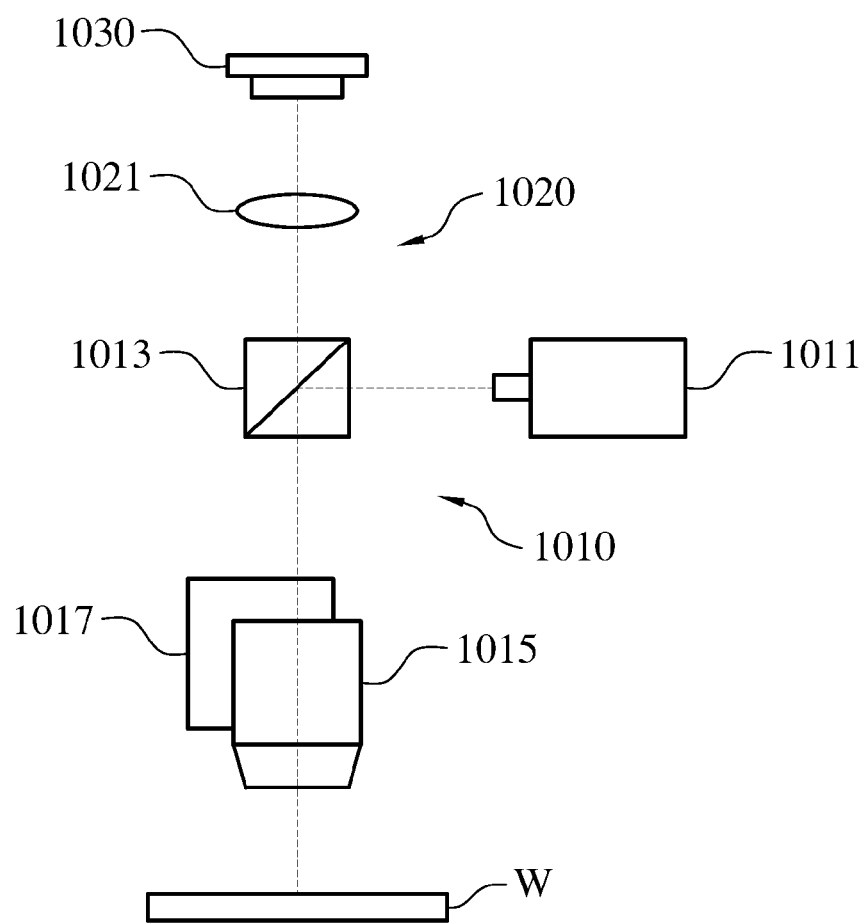
FIG. 6 is a schematic view illustrating an overlay measurement apparatus according to an embodiment of the present disclosure.

FIG. 6 is a schematic view illustrating an overlay measurement apparatus according to an embodiment of the present disclosure. As illustrated in FIG. 6, an overlay measurement apparatus 1000 includes an illumination optical system 1010 illuminating an overlay mark on a semiconductor wafer W, an imaging optical system 1020 imaging an overlay mark image by condensing light reflected from the overlay mark, and an image detector 1030 obtaining the overlay mark image that is imaged by the imaging optical system 1020. The overlay measurement apparatus 1000 may measure an overlay between a plurality of consecutive pattern layers by processing an obtained overlay mark image.

The illumination optical system 1010 may be configured by using various optical elements. For example, the illumination optical system 1010 may include an illumination source 1011, a beam splitter 1013, and an objective lens 1015. In addition, the illumination optical system 1010 may further include optical elements such as another lens, an aperture, and so on.

The illumination source 1011 serves to generate illumination for illuminating the overlay mark. The illumination source 1011 may include a light source configured to generate light in a wide wavelength range, and may include a tunable optical filter capable of adjusting a wavelength range of light passing therethrough.

The beam splitter 1013 is disposed between the illumination source 1011 and the objective lens 1015, and serves to transmit illumination from the illumination source 1011 to the objective lens 1015.

The objective lens 1015 serves to condense light to a specific position on a surface of the semiconductor wafer W, and serves to collect light reflected from the specific position. The objective lens 1015 is mounted on a lens focusing actuator 1017. The lens focusing actuator 1017 is used for adjusting a distance between the objective lens 1015 and the semiconductor wafer W.

The imaging optical system 1020 may be configured by using various optical elements. For example, the imaging optical system 1020 may include a tube lens 1021. In addition, the imaging optical system 1020 may use the objective lens 1015 and the beam splitter 1013 of the illumination optical system 1010. In addition, the imaging optical system 1020 may further include optical elements such as another lens, an aperture, and so on.

Reflected light collected from the objective lens 1015 is condensed in the image detector 1013 by the tube lens 1021 after the reflected light is passing through the beam splitter 1013.

The image detector 1030 serves to receiving light reflected from the overlay mark and to generate the overlay mark image. The image detector 1030 may be a CCD camera or a CMOS camera.

The process of analyzing the Moire pattern image may include a process of measuring offsets of an X-axis direction center of the first Moire pattern $M_1$ and an X-axis direction center of the second Moire pattern $M_2$ from the obtained Moire pattern image, and may include a process of measuring offsets of a Y-axis direction center of the third Moire pattern $M_3$ and a Y-axis direction center of the fourth Moire pattern $M_4$ from the obtained Moire pattern image.

The process of measuring the offsets of the X-axis direction center of the first Moire pattern $M_1$ and the X-axis direction center of the second Moire pattern $M_2$ may include following processes.

Firstly, a difference between an X value of the first center of symmetry $COS_1$ of the first Moire pattern $M_1$ and a reference point of the obtained Moire pattern image in which the reference point is an X value of a center of image COI of the obtained Moire pattern as an example is obtained. The center of image COI is a center of an image area, and is not related to the center of symmetry of the paired Moire patterns. In FIG. 1, for the convenience, the center of image COI is illustrated as coincident with the first center of symmetry $COS_1$ of the first Moire pattern $M_1$, but mostly does not coincide with the first center of symmetry $COS_1$ of the first Moire pattern $M_1$.

As illustrated in FIG. 1, in the obtained Moire pattern image, a partial region $R_1$ of the first Moire pattern $M_1$ positioned at an upper side is selected. Then, a region $R_2$ that is symmetrical by 180 degrees with respect to the center of the obtained Moire pattern image is also selected. The region $R_2$ is positioned at the other first Moire pattern $M_1$ positioned at a lower side.

Then, by comparing two-dimensional images of the selected two regions $R_1$ and $R_2$, a difference between an X value of the center of the first Moire pattern $M_1$ and an X value of the center of image of the obtained Moire pattern is obtained.

Next, by using the same method, a difference between an X value of the second center of symmetry $COS_2$ of the second Moire pattern $M_2$ and the X value of the center of image COI of the obtained Moire pattern is obtained.

Next, by using the difference between the X value of the first center of symmetry $COS_1$ of the first Moire pattern $M_1$ and the X value of the center of image COI of the obtained Moire pattern image and the difference between the X value of the second center of symmetry $COS_2$ of the second Moire pattern $M_2$ and the X value of the center of image COI of the obtained Moire pattern image, an overlay value in the X-axis direction is obtained.

This difference value $\Delta M_x$ is a value magnified by the Moire gain value, so that an actual overlay error $\Delta X$ in the X-axis direction may be obtained by dividing the difference value by the Moire gain value in accordance with Equation 9 below.

$$\Delta X = \frac{\Delta M_X}{G_{M_1} - G_{M_2}} \quad \text{[Equation 9]}$$

In Equation 9, $\Delta X$ is an overlay error in the X-axis direction, $\Delta M_x$ is a difference between the first center of symmetry $COS_1$ and the second center of symmetry $COS_2$ in the X-axis direction. As described in an exemplary embodiment above, when signs of the first Moire gain $G_{M1}$ and the second Moire gain $G_{M2}$ are opposite to each other, there is an advantage that a rate magnified by the Moire gains is large.

Next, by using the same method, a difference between a Y value of the third center of symmetry $COS_3$ of the third Moire pattern $M_3$ and a Y value of the center of image COI of the obtained Moire pattern is obtained. Then, a difference between a Y value of the fourth center of symmetry $COS_4$ of the fourth Moire pattern $M_4$ and the Y value of the center of image COI of the obtained Moire pattern is obtained.

Next, by using the difference between the Y value of the third center of symmetry $COS_3$ of the third Moire pattern $M_3$ and the Y value of the center of the image of the obtained Moire pattern and the difference between the Y value of the fourth center of symmetry $COS_4$ of the fourth Moire pattern $M_4$ and the Y value of the center of the image of the obtained Moire pattern, an overlay value in the Y-axis direction is obtained. This difference value $\Delta M_Y$ is a value magnified by the Moire gain value, so that an actual overlay error $\Delta Y$ in the Y-axis direction may be obtained by dividing the difference value by the Moire gain value in accordance with Equation 10 below.

$$\Delta Y = \frac{\Delta M_Y}{G_{M_2} - G_{M_4}} \quad \text{[Equation 10]}$$

In Equation 10, $\Delta Y$ is an overlay error in the Y-axis direction, $\Delta M_Y$ is a difference between the third center of symmetry $COS_3$ and the fourth center of symmetry $COS_4$ in the Y-axis direction.

Hereinafter, a manufacturing method of a semiconductor device by using the overlay mark 10 illustrated in FIG. 1 will be described. The manufacturing method of the semiconductor device by using the overlay mark 10 starts with a process of forming the overlay mark 10. The overlay mark 10 is formed simultaneously with forming two consecutive pattern layers.

The process of forming the overlay mark 10 may be a process of forming the overlay mark 10 by using an exposure apparatus in a scanner type.

Next, an overlay value is measured by using the overlay mark 10. A process of measuring the overlay value is the same as described in the overlay measurement method described above.

Finally, the measured overlay value is used in a process control for forming two consecutive pattern layers or forming two patterns separately formed on one pattern layer. That is, the derived overlay value in the process control is utilized so that the consecutive pattern layers or the two patterns are formed at a predetermined position.

Embodiments described above are merely to describe preferred embodiments of the present disclosure, and the scope of the present disclosure is not limited to the described embodiments. In addition, various changes, modifications, or substitutions may be made by those skilled in the art within the spirit and claims of the present disclosure, and such embodiments should be regarded as falling within the scope of the present disclosure.

What is claimed is:

1. An overlay mark for measuring an overlay based on an image, the overlay mark being configured to determine a relative misalignment between at least two pattern layers, and the overlay mark comprising:

a first overlay mark comprising a pair of first grating patterns, the pair of first grating patterns being formed together with a first pattern layer, and the pair of first grating patterns having a first pitch along a first direction and being rotationally symmetrical by 180 degrees with each other; and a second overlay mark comprising a pair of second grating patterns and a pair of third grating patterns, the pair of second grating patterns being formed together with a second pattern layer, the pair of second grating patterns having a second pitch along the first direction in which the second pitch is different from the first pitch, the pair of second grating patterns partially overlapping the first grating patterns and being rotationally symmetrical by 180 degrees with each other, the pair of third grating patterns being formed together with the second pattern layer, the pair of third grating patterns having a third pitch along the first direction in which the third pitch is different from the first pitch and the second pitch, and the pair of third grating patterns partially overlapping the first grating patterns and being rotationally symmetrical by 180 degrees with each other, wherein the first grating patterns and the second grating patterns that overlap each other form a pair of first Moire patterns rotationally symmetrical by 180 degrees with respect to a first center of symmetry, wherein the first grating patterns and the third grating patterns that overlap each other form a pair of second Moire patterns rotationally symmetrical by 180 degrees with respect to a second center of symmetry, wherein the first grating patterns comprise a plurality of first bars having a first bar length, the second grating patterns comprise a plurality of second bars having a second bar length, the third grating patterns comprise a plurality of third bars having a third bar length, and the first bar length is equal to or more than a sum of the second bar length and the third bar length, wherein the first center of symmetry and the second center of symmetry coincide with each other when an overlay error is zero, and wherein an error in the first direction between the first center of symmetry and the second center of symmetry represents an overlay error in the first direction between the first pattern layer and the second pattern layer.

2. The overlay mark of claim 1, wherein the second grating patterns and the third grating patterns are disposed parallel to each other.

3. The overlay mark of claim 1, wherein one of the second pitch and the third pitch is larger than the first pitch and the other of the second pitch and the third pitch is smaller than the first pitch.

4. The overlay mark of claim 1, wherein pitches of the first and the second Moire patterns are larger than an optical resolution of an overlay measurement apparatus, and the first to the third pitches of the first to the third grating patterns are smaller than the optical resolution of the overlay measurement apparatus.

5. The overlay mark of claim 1, wherein:

the first overlay mark further comprises a pair of fourth grating patterns, the pair of fourth grating patterns being formed together with the first pattern layer, and the pair of fourth grating patterns having a fourth pitch along a second direction orthogonal to the first direction and being rotationally symmetrical by 180 degrees with each other, the second overlay mark comprises a pair of fifth grating patterns and a pair of sixth grating patterns, the pair of fifth grating patterns being formed together with the second pattern layer, the pair of fifth grating patterns having a fifth pitch along the second direction in which the fifth pitch is different from the fourth pitch, the pair of fifth grating patterns partially overlapping the fourth grating patterns and being rotationally symmetrical by 180 degrees with each other, the pair of sixth grating patterns being formed together with the second pattern layer, the pair of sixth grating patterns having a sixth pitch along the second direction in which the sixth pitch is different from the fourth pitch and the fifth pitch, and the pair of sixth grating patterns partially overlapping the fourth grating patterns and being rotationally symmetrical by 180 degrees with each other, the fourth grating patterns and the fifth grating patterns that overlap each other form a pair of third Moire patterns rotationally symmetrical by 180 degrees with respect to a third center of symmetry, the fourth grating patterns and the sixth grating patterns that overlap each other form a pair of fourth Moire patterns rotationally symmetrical by 180 degrees with respect to a fourth center of symmetry, the third center of symmetry and the fourth center of symmetry coincide with each other when the overlay error is zero, and an error in the second direction between the third center of symmetry and the fourth center of symmetry represents the overlay error in the second direction between the first pattern layer and the second pattern layer.

* * * * *